(12) United States Patent
Copple (10) Patent No.: US 7,102,895 B1
(45) Date of Patent: Sep. 5, 2006

(54) BRACKET ASSEMBLY USED TO CONNECT A PLUG-IN CARD TO A BACKPLANE

(75) Inventor: David B. Copple, Coppell, TX (US)

(73) Assignee: Alcatel, Paris (FR)

( * ) Notice: Subject to any disclaimer, the term of this patent is extended or adjusted under 35 U.S.C. 154(b) by 742 days.

(21) Appl. No.: 10/186,418

(22) Filed: Jul. 1, 2002

(51) Int. Cl.
*H05K 7/14* (2006.01)
*H05K 7/18* (2006.01)

(52) U.S. Cl. .................. 361/802; 361/801; 361/759
(58) Field of Classification Search ........... 248/223.41, 248/224.61, 225.11, 694; 361/759, 683, 361/801, 802, 803, 804, 756; 455/562.1; 211/41.1; 439/327, 330
See application file for complete search history.

(56) References Cited

U.S. PATENT DOCUMENTS

| | | | | |
|---|---|---|---|---|
| 3,627,140 A * | 12/1971 | Yanikoski | ................ | 211/41.17 |
| 4,745,524 A * | 5/1988 | Patton, III | ................ | 361/683 |
| 5,642,263 A * | 6/1997 | Lauruhn | ................ | 361/801 |
| 5,822,197 A * | 10/1998 | Thuault | ................ | 361/803 |
| 5,854,738 A * | 12/1998 | Bowler | ................ | 361/695 |
| 6,056,574 A * | 5/2000 | Yeomans et al. | ........... | 439/327 |
| 6,285,556 B1 * | 9/2001 | Guth et al. | ................ | 361/752 |
| 6,331,940 B1 * | 12/2001 | Lin | ................ | 361/785 |
| 6,418,028 B1 * | 7/2002 | Nariyama | ................ | 361/759 |
| 6,618,262 B1 * | 9/2003 | Ta | ................ | 361/759 |
| 6,735,091 B1 * | 5/2004 | Megason et al. | ........... | 361/801 |

* cited by examiner

*Primary Examiner*—Amy J. Sterling
(74) *Attorney, Agent, or Firm*—William J. Tucker; TTom Gellenthien; V. Lawrence Sewell (57) ABSTRACT

A bracket assembly and a method for using the bracket assembly to connect one or more plug-in cards to a backplane are described herein. The bracket assembly includes a frame that has two pairs of guide support arms which guide and support the plug-in card while it is being connected to the backplane. The first pair of guide support arms includes a top guide support arm positioned a predetermined distance over a bottom guide support arm both of which include a notch formed therein that is sized to receive a side edge of the plug-in card. Likewise, the second pair of guide support arms includes a top guide support arm positioned a predetermined distance over a bottom guide support arm both of which include a notch formed therein that is sized to receive the other side edge of the plug-in card.

14 Claims, 7 Drawing Sheets

BRACKET ASSEMBLY USED TO CONNECT A PLUG-IN CARD TO A BACKPLANE

BACKGROUND OF THE INVENTION

1. Field of the Invention

The present invention relates in general to a bracket assembly used to guide and support a plug-in card while it is being connected to a backplane or disconnected from the backplane that is located in an enclosure.

2. Description of Related Art

Figure 1:
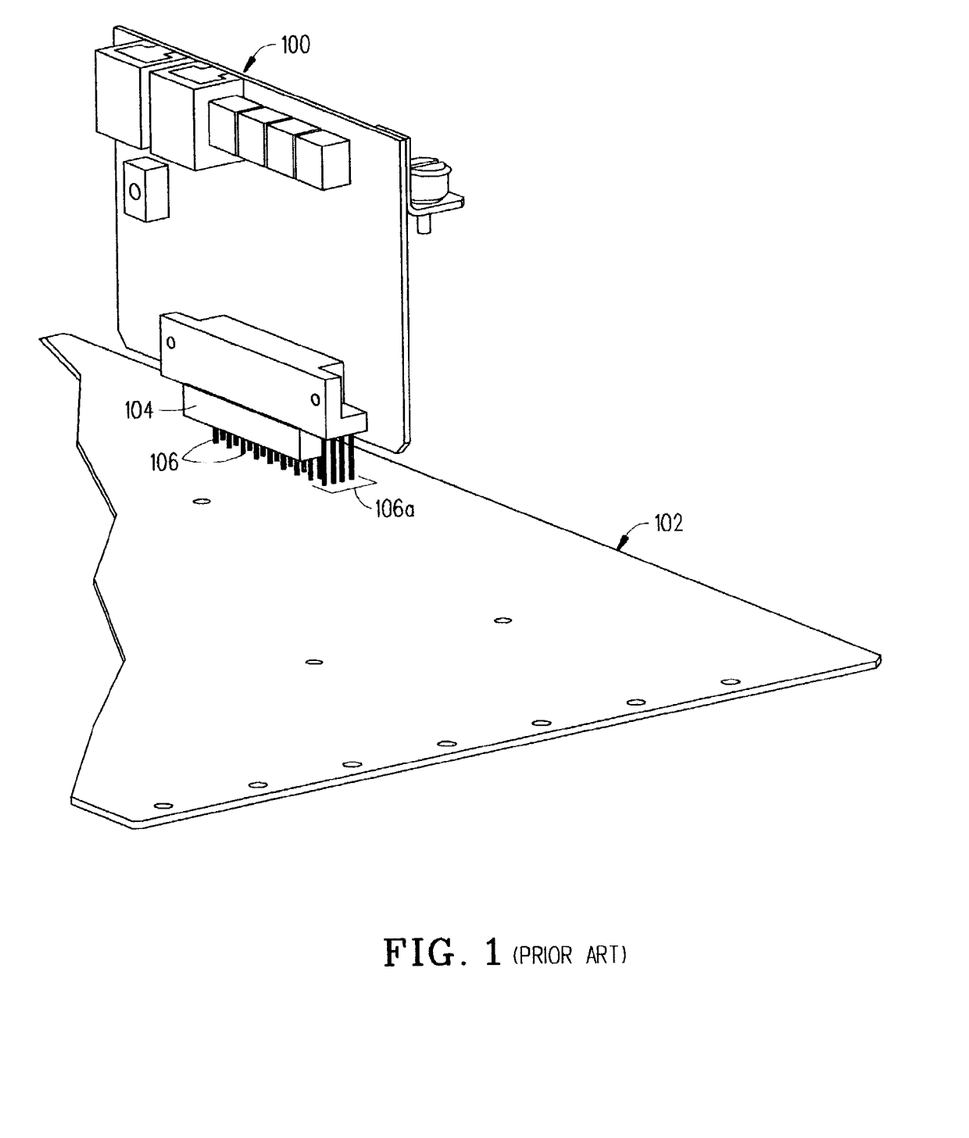
FIG. 1 (PRIOR ART) is a perspective view illustrating how a plug-in card can be easily misaligned with the pins in a backplane when the plug-in card is connected to the backplane without the aid of the bracket assembly of the present invention.

In the telecommunications field, many enclosures like a Signaling Transfer Point (STP) enclosure contain a lot of plug-in cards, backplanes, cables etc . . . in a relatively small area which makes it very difficult for service personnel to work within the enclosure. For instance, service personnel often have difficulty seeing through all the cables in a crowded enclosure and as a result have a hard time properly connecting a plug-in card (e.g., personality module) to one of the backplanes. In particular, the service personnel may not be able to see through the cables routed in front of the backplane which makes it hard for them to properly align and connect a plug-in card to a set of pins extending from the backplane. Referring to FIG. 1, there is a perspective view of a plug-in card 100 that is not properly connected to a backplane 102. As shown, the plug-in card 100 has a connector 104 which was misaligned when it was connected to pins 106 extending from the backplane 102. The plug-in card 100 is misaligned because there is a row of pins 106*a* extending from the backplane 102 which should have interfaced with the connector 104. It is easy to understand how service personnel working in a crowded enclosure (not shown) could easily misalign and fail to properly connect the plug-in card 100 to the backplane 102. Of course, when the plug-in card 100 does not properly connect to the backplane 102 then that plug-in card 100 and possibly the other plug-in cards (not shown) in the enclosure would not work properly. In fact, the service personnel could misalign the plug-in card 100 and bend the pins 106*a* in the backplane 102 which would also be very problematical. Accordingly, there is a need for a bracket assembly that can be used to guide and support a plug-in card in a manner such that the plug-in card can be easily and properly connected to a backplane. This need and other needs are addressed by the bracket assembly and method of the present invention.

BRIEF DESCRIPTION OF THE INVENTION

The present invention includes a bracket assembly and a method for using the bracket assembly to connect one or more plug-in cards to a backplane. The bracket assembly includes a frame that has two pairs of guide support arms which guide and support the plug-in card while it is being connected to the backplane. The first pair of guide support arms includes a top guide support arm positioned a predetermined distance over a bottom guide support arm both of which include a notch formed therein that is sized to receive a side edge of the plug-in card. Likewise, the second pair of guide support arms includes a top guide support arm positioned a predetermined distance over a bottom guide support arm both of which include a notch formed therein that is sized to receive the other side edge of the plug-in card. A user would interact with a top edge of the plug-in card to move the two side edges of the plug-in card within the notches of the two pairs of guide support arms in a manner that enables a connector on a bottom edge of the plug-in card to be connected to the backplane. The bracket assembly can also be used to disconnect the plug-in card from the backplane.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Figure 2A:
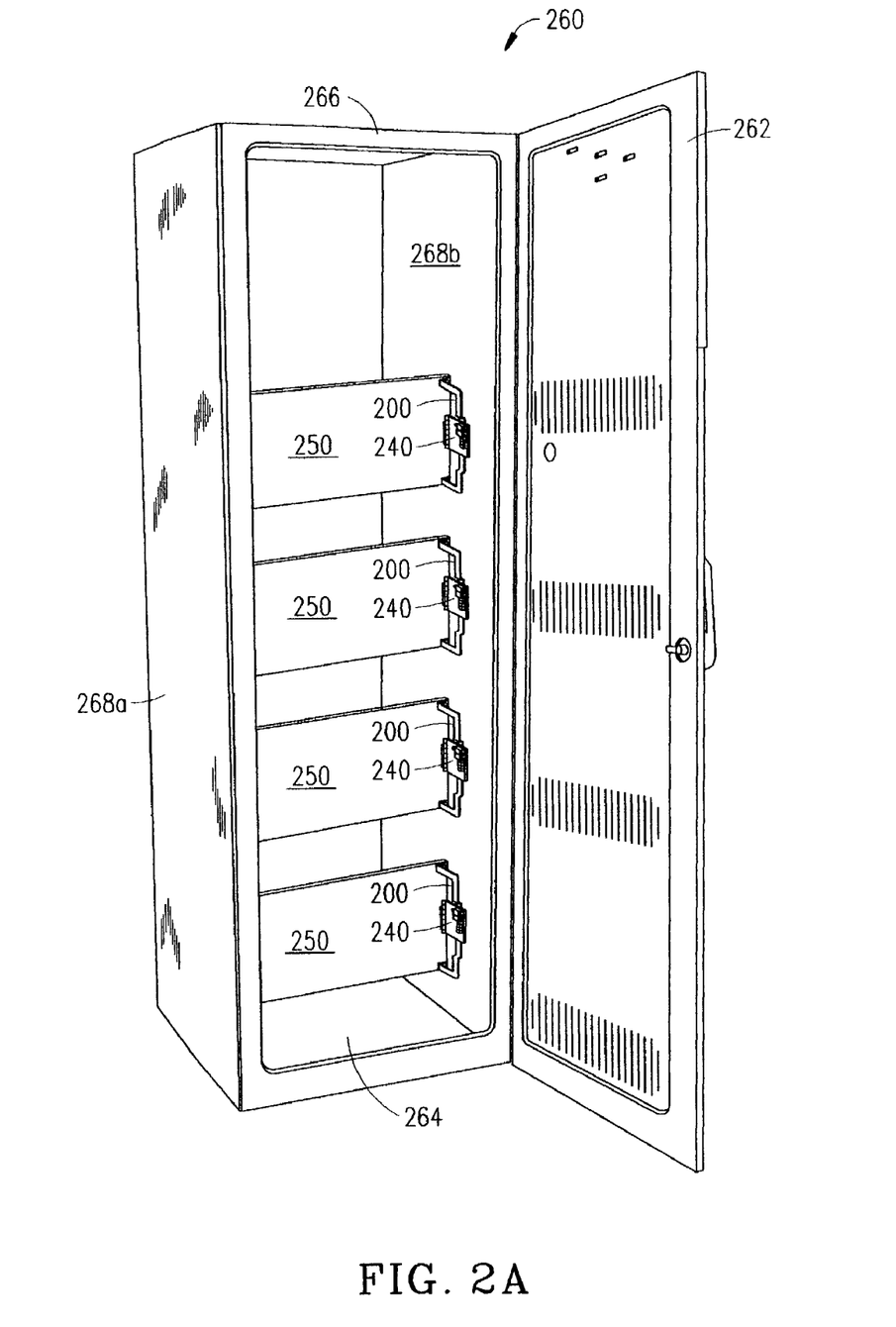
FIG. 2A is a perspective view of an enclosure containing a series of backplanes each of which has attached thereto a plug-in card that is supported by a first embodiment of the bracket assembly in accordance with the present invention.
Figure 2B:
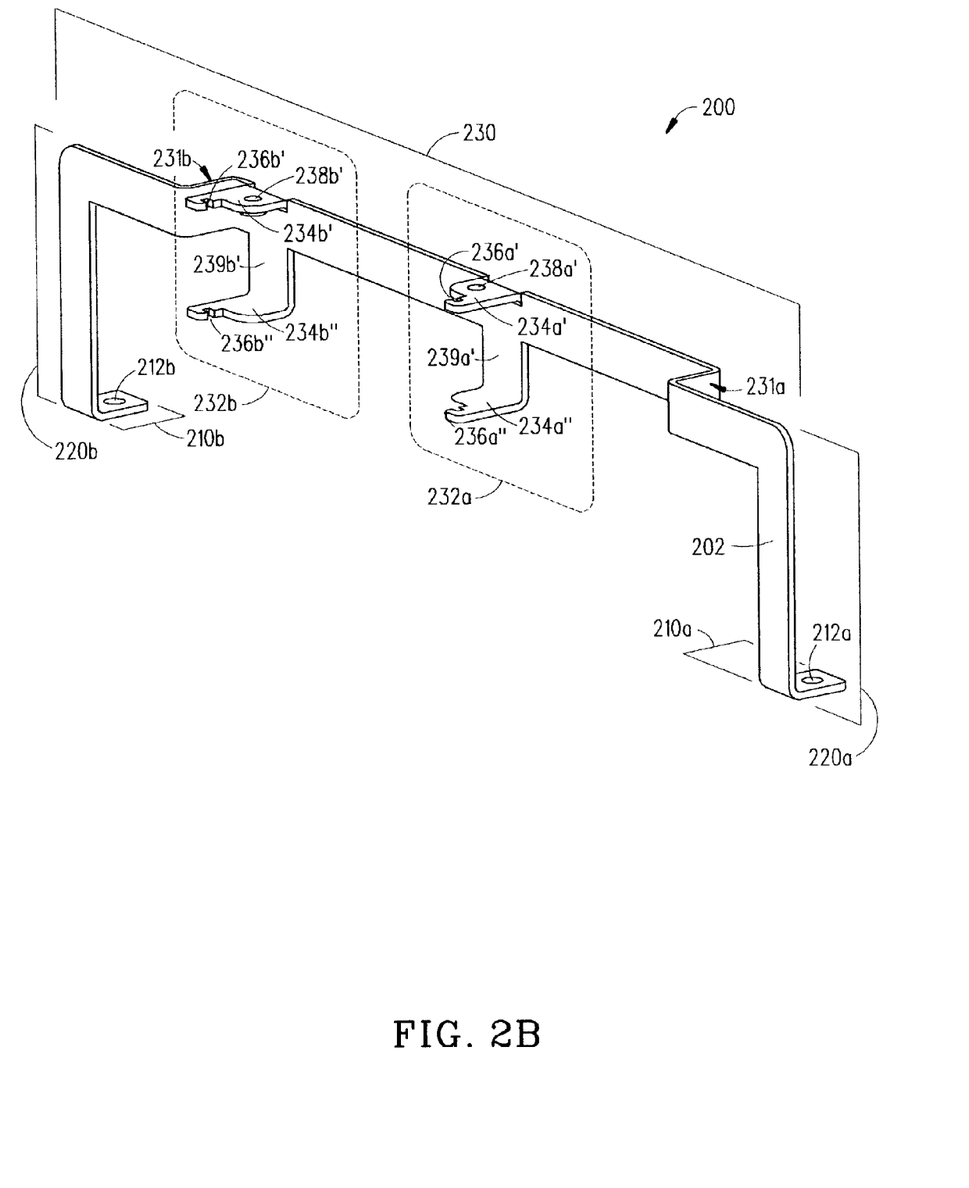
FIG. 2B is a perspective view showing in greater detail one of the bracket assemblies shown in FIG. 2A.
Figure 2C:
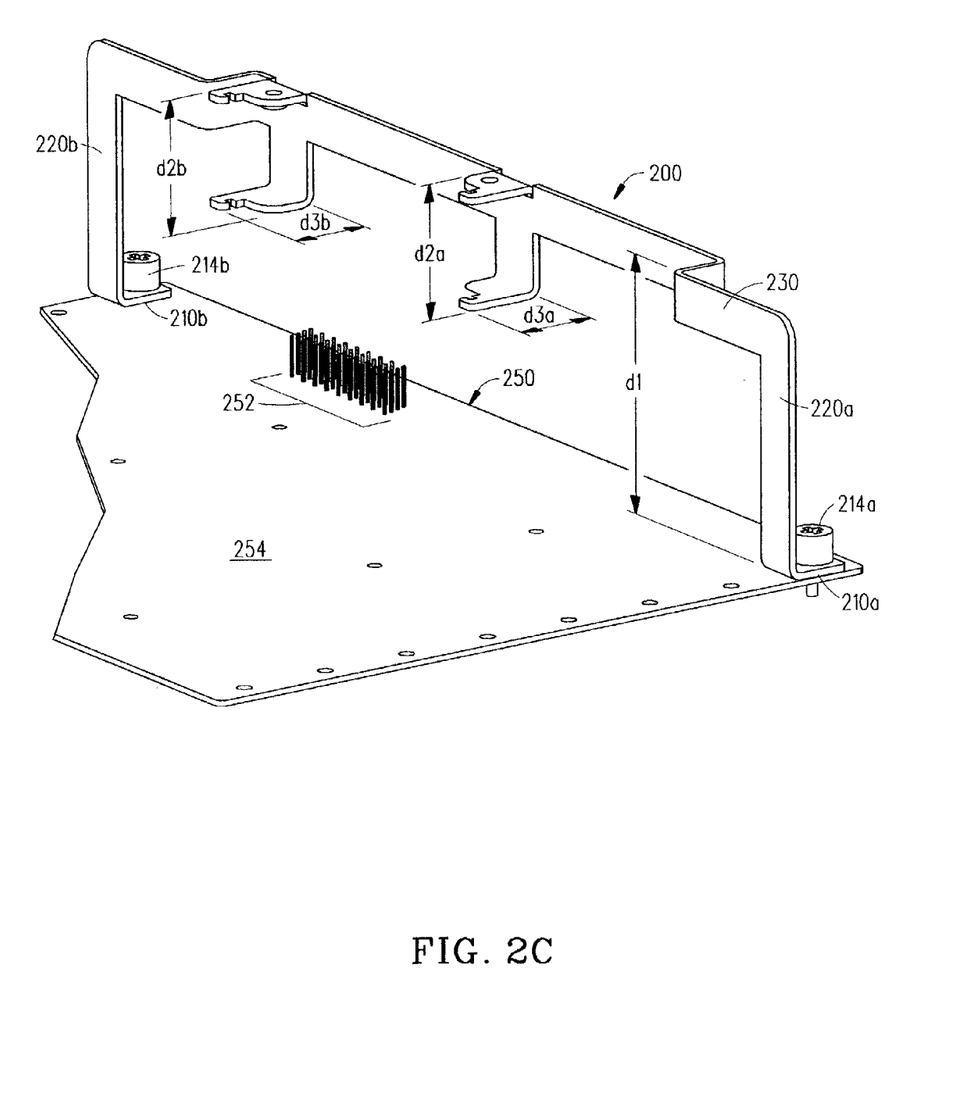
FIG. 2C is a perspective view of one of the bracket assemblies without a plug-in card that is connected to one of the backplanes shown in FIG. 2A.
Figure 2D:
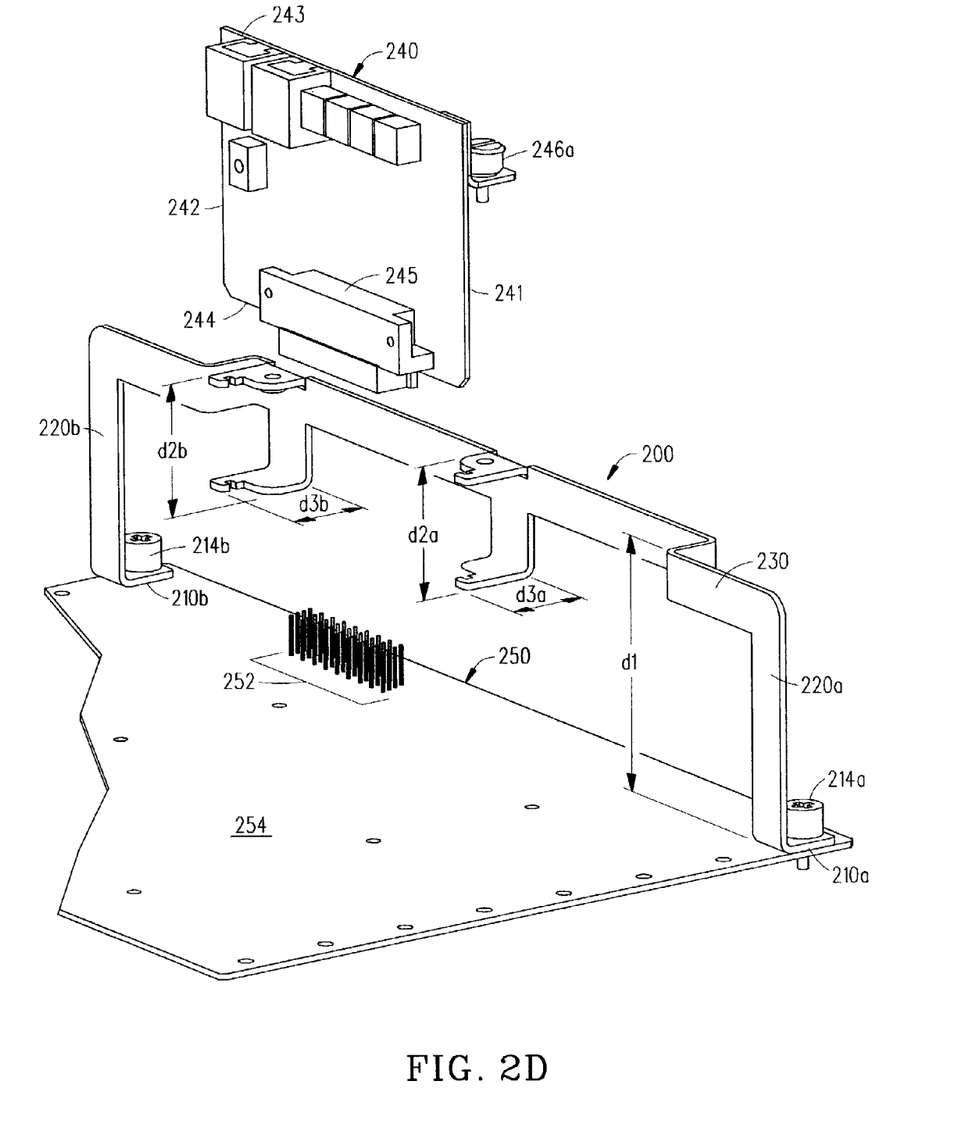
FIG. 2D is a perspective view of one of the bracket assemblies that is about to receive and guide a plug-in card into the pins extending from one of the backplanes shown in FIG. 2A.
Figure 2E:
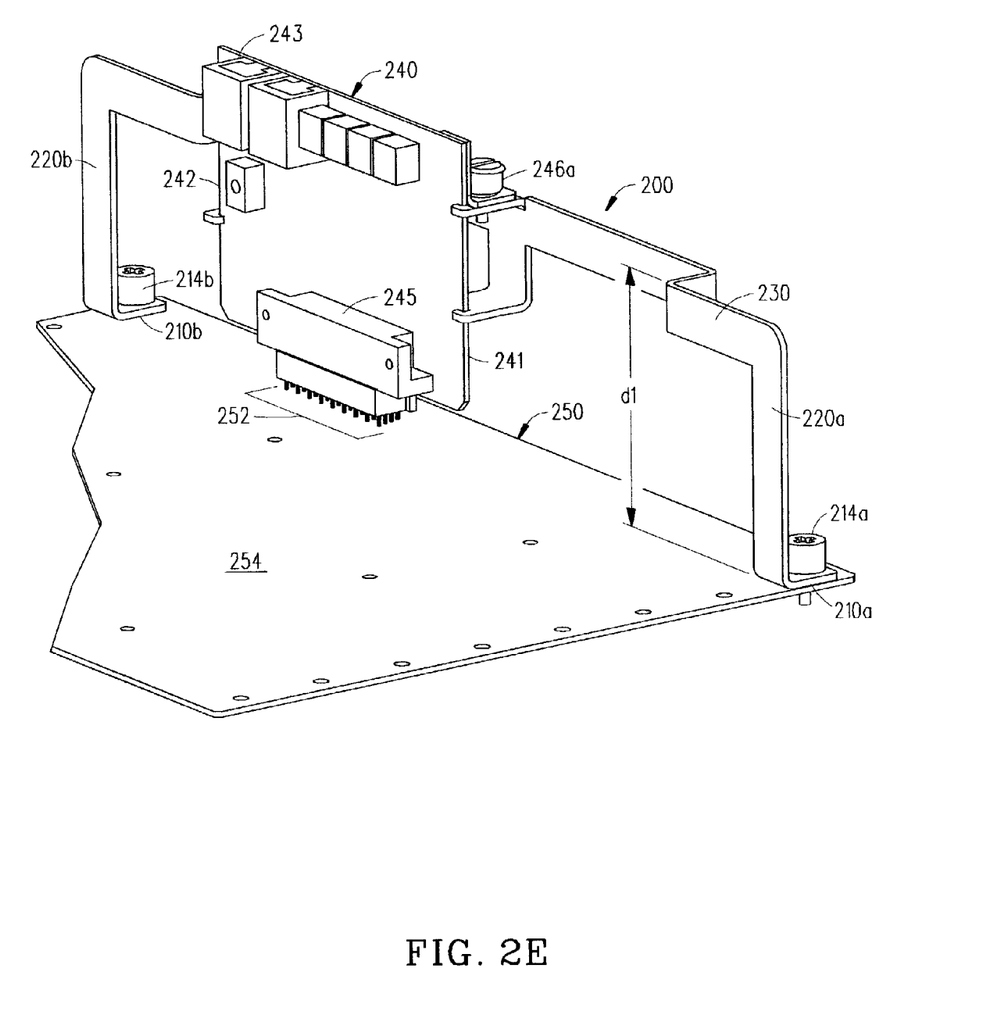
FIG. 2E is a perspective view of one of the bracket assemblies that is supporting a plug-in card which was connected to the pins extending from one of the backplanes shown in FIG. 2A.
Figure 3:
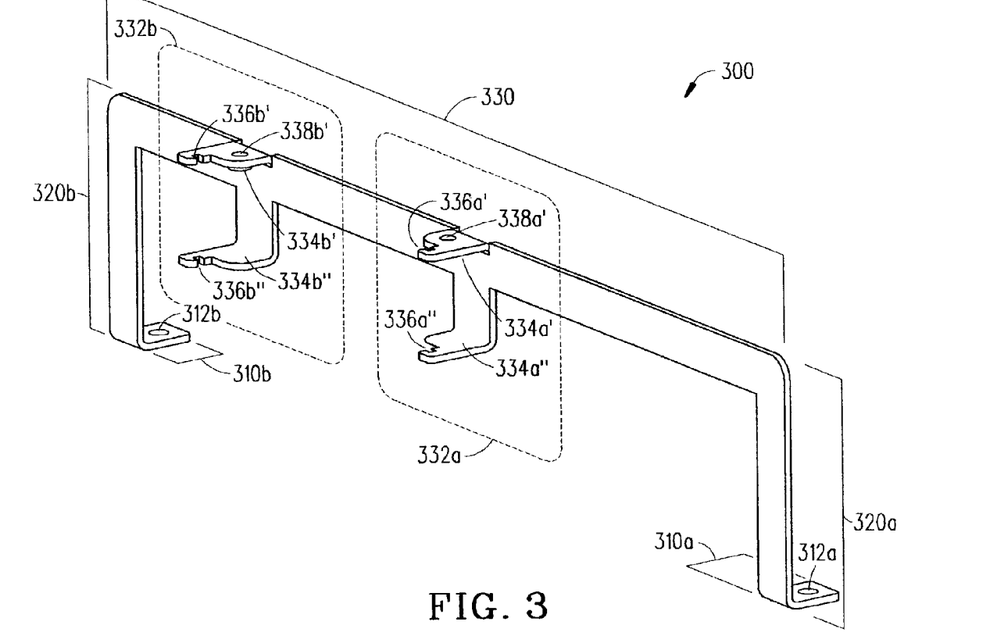
FIG. 3 is a perspective view of a second embodiment of the bracket assembly in accordance with the present invention.
Figure 4:
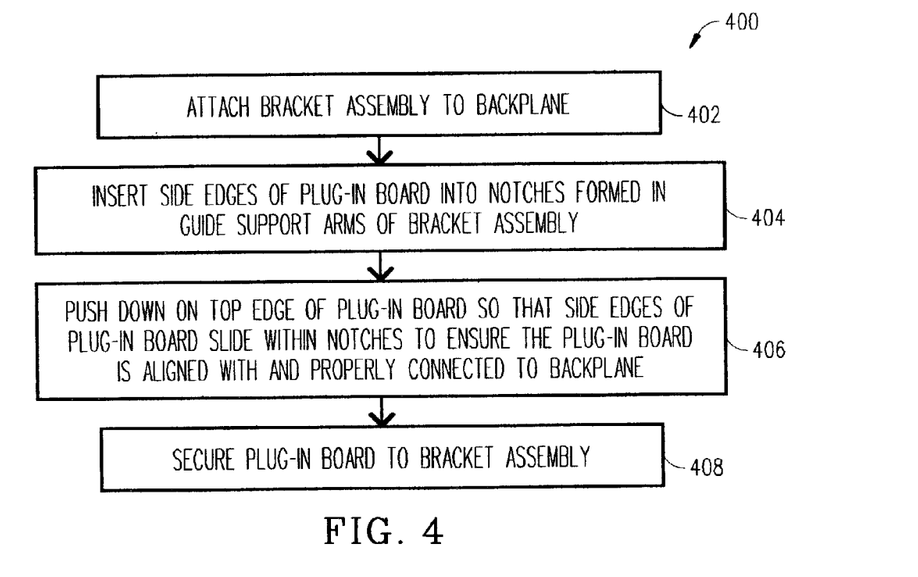
FIG. 4 is a flowchart illustrating the basic steps of a preferred method for using the bracket assembly shown in FIGS. 2–3 to guide and support a plug-in card while it is being connected to or disconnected from the backplane.

Referring to FIGS. 2–4, there are disclosed in accordance with the present invention a bracket assembly 200 and 300 and a method 400 for using the bracket assembly 200 and 300 to guide and support a plug-in card 240 while it is being connected to or disconnected from a backplane 250. Two embodiments of the bracket assembly 200 and 300 are described below with respect to FIGS. 2 and 3.

Referring to FIG. 2A, there is shown a perspective view of an enclosure 260 containing multiple bracket assemblies 200, multiple plug-in cards 240 and multiple backplanes 250. The enclosure 260 includes a door 262, a bottom side 264, a top side 266 and two opposite and spaced side walls 268*a* and 268*b*. The two side walls 268*a* and 268*b* extend from the bottom side 264 and the top side 266 to define there between an interior space for accommodating one or more backplanes 250 (only four shown). Of course, the enclosure 260 also includes other components such as cables, air ducts, support brackets etc . . . all of which are well known in the industry. However, for clarity, the description provided in relation to the enclosure 260 omits the components not necessary to understand the present invention. The enclosure 260 can be any size.

It should be understood that each backplane 250 can have attached thereto one or more bracket assemblies 200. Even though only one bracket assembly 200 is shown herein as being attached to one backplane 250. Moreover, it should be understood that each bracket assembly 200 can support one or more plug-in cards 240. Even though only one plug-in card 240 is shown herein as being supported by one bracket assembly 200.

Referring to FIGS. 2B–2E, there are several perspective views showing in greater detail one bracket assembly 200, plug-in card 240 and backplane 250. The bracket assembly 200 includes a U-shaped frame 202 that can receive and guide the plug-in card 240 so that it can be easily and properly connected to or disconnected from pins 252 extending from the backplane 250 (see FIGS. 2D–2E). In particular, the bracket assembly 200 includes two support portions 210a and 210b, two leg portions 220a and 220b and a central portion 230 (see FIG. 2B). In the preferred embodiment, the bracket assembly 200 is manufactured from one piece of metal or non-conductive material. Alternatively, the bracket assembly 200 can be made from plastic using an injection-molding machine.

The two support portions 210a and 210b are horizontally oriented with respect to a top surface 254 of the backplane 250 (see FIGS. 2C–2E). Each support portion 210a and 210b preferably has a hole 212a and 212b formed therein in which a fastener such as a captive screw 214a and 214b can be used to secure the bracket assembly 200 to the backplane 250 (see FIGS. 2C–2E). The captive screws 212a and 212b are used instead of regular bolts to prevent the possibility of hardware from falling into the enclosure 260 (see FIG. 2A).

The leg portions 220a and 220b are connected to and respectively extend upward from the two support portions 210a and 210b. As shown in FIGS. 2C–2E, the leg portions 220a and 220b are vertically oriented with respect to the support portions 210a and 210b and the top surface 254 of the backplane 250. The top sections of the leg portions 220a and 220b are connected to one another by the central portion 230. The central portion 230 is horizontally oriented with respect to the support portions 210a and 210b and the top surface 254 of the backplane 250. The central portion 230 is located a predetermined distance "$d_1$" above the top surface 254 of the backplane 250. The distance "$d_1$" is selected based on the height of the plug-in card 240 and is preferably less than the height of the plug-in card 240. The central portion 230 may have offsets 231a and 231b (only two shown in FIG. 2B) formed therein which can be used to give the user easy access to certain areas on the backplane 250.

The central portion 230 includes a first pair of guide support arms 232a that include a top guide support arm 234a' and a bottom guide support arm 234a" (see FIG. 2B). The top guide support arm 234a' is horizontally oriented and positioned a predetermined distance "$d_{2a}$" over the horizontally oriented bottom guide support arm 234a" (see FIGS. 2C–2D). The horizontally oriented bottom guide support arm 234a" is connected to a vertically oriented tab 239a' extending downward from the central portion 230 (see FIG. 2B). The top guide support arm 234a' and the bottom guide support arm 234a" include notches 236a' and 236a" respectively formed therein that are sized to receive a side edge 241 of the plug-in card 240 (see FIGS. 2B and 2E). The distance "$d_{3a}$" the notches 236a' and 236a" are located from the main body of the central portion 230 is related to how much space is needed to enable components extending from the plug-in card 240 to clear the central portion 230 (see FIGS. 2C and 2D).

As shown in FIGS. 2D–2E, the plug-in card 240 includes two side edges 241 and 242, a top edge 243 and a bottom edge 244. The bottom edge 244 has a connector 245 that can be connected to or disconnected from the pins 252 in the backplane 250. There are a wide variety of plug-in cards 240 including, for example, personality modules (transition modules), power cards, processor cards, timing distribution cards and signaling cards.

Referring back to the bracket assembly 200, the central portion 230 further includes a second pair of guide support arms 232b that include a top guide support arm 234b' and a bottom guide support arm 234b" (see FIG. 2B). The top guide support arm 234b' is horizontally oriented and positioned a predetermined distance "$d_{2b}$" over the horizontally oriented bottom guide support arm 234b" (see FIGS. 2C–2D). The horizontally oriented bottom guide support arm 234b" is connected to a vertically oriented tab 239b' extending downward from the central portion 230 (see FIG. 2B). The top guide support arm 234b' and the bottom guide support arm 234b" include notches 236b' and 236b" respectively formed therein that are sized to receive the other side edge 242 of the plug-in card 240 (see FIGS. 2B and 2E). The distance "$d_{3b}$" the notches 236b' and 236b" are located from the central portion 230 is related to how much space is needed to enable components extending from the plug-in card 240 to clear the central portion 230 (see FIGS. 2C–2D).

The distances "$d_{2a}$" and "$d_{2b}$" are selected such that the plug-in card 240 can be easily inserted into and moved within the notches 236a', 236a", 236b' and 236b" while ensuring that the plug-in card 240 remains properly aligned with the pins 252 in the backplane 250 (see FIGS. 2B–2E). If the distances "$d_{2a}$" and "$d_{2b}$" are too large then the user may have an easy time inserting the plug-in card 240 into the top notches 236a' and 236b' but a difficult time inserting the plug-in card 240 into the bottom notches 236a" and 236b". In contrast, if the distance "$d_{2a}$" and "$d_{2b}$" are too small then the plug-in card 240 may not remain properly aligned with the pins 252 in the backplane 250. For instance, the plug-in card 240 may be inserted into the notches 236a', 236a", 236b' and 236b" but still may be moved in a lateral direction relative to the top surface 254 of the backplane 250 and as such become misaligned with the pins 252 in the backplane 250.

To use the bracket assembly 200 to connect the plug-in card 240 to the backplane 250, the user would place the plug-in card 240 between the guide support arms 232a and 232b and interact with the top edge 243 of the plug-in card 240 to move both side edges 241 and 242 of the plug-in card 240 within the notches 236a', 236a", 236b' and 236b" of the guide support arms 234a', 234a", 234b' and 234b" (see FIGS. 2D and 2E). In this manner, the user can easily and properly connect the connector 245 on the plug-in card 240 to the pins 252 in the backplane 250 (see FIG. 2E). In fact, the user can use the bracket assembly 200 to connect the plug-in card 240 to the backplane 250 even though the user may not be able to see the pins 252 in the backplane 250 due to cables or other plug-in cards located in front of the backplane 250. In addition, the user can use the bracket assembly 200 to easily and properly disconnect the plug-in card 240 from the backplane 250 without worrying about bending the pins 252 in the backplane 250.

Once the plug-in card 240 is connected to the backplane 250, then the user can secure the plug-in card 240 to the bracket assembly 200 (see FIG. 2E). To accomplish this, the user can turn captive screws 246a (only one shown) into attachment holes 238a' and 238b' that are formed within the top guide support arms 234a' and 234b', respectively. After this is done and if the distance "$d_1$" between the central portion 230 and the backplane 250 is properly selected, then the user at this point can be sure that the plug-in card 240 is properly connected and fully engaged to the backplane 250.

It should be readily appreciated by those skilled in the art that the bracket assembly of the present invention can take many different forms other than the illustrated form of bracket assembly 200. For example, the bracket assembly 200 can be configured to support multiple plug-in cards 240. In addition, the bracket assembly 200 can have one or more middle guide support arms (not shown) located between the top guide support arms 334a' and 334b' and the bottom guide support arms 334a" and 334b".

It should also be readily appreciated by those skilled in the art that the width of the notches 236a', 236a", 236b' and 236b" should not be much wider than the sides 241 and 242 of the plug-in card 242. Because, if the notches 236a', 236a", 236b' and 236b" are too wide, then the plug-in card 242 may not remain properly aligned with the pins 252 in the backplane 250.

Referring to FIG. 3, there is a perspective view of a second embodiment of the bracket assembly 300 in accordance with the present invention. The bracket assembly 300 has components similar to bracket assembly 200 except that the central portion 330 does not have the offsets 231a and 231b associated with the central portion 230 of the bracket assembly 200. To avoid repetition, the bracket assembly 300 are not described in great detail below since it has basically the same structure and functionality as bracket assembly 200.

As shown, the bracket assembly 300 includes two support portions 310a and 310b, two leg portions 320a and 320b and a central portion 330. Each support portion 310a and 310b preferably has a hole 312a and 312b formed therein. The leg portions 320a and 320b are connected to and respectively extend upward from the two support portions 310a and 310b. The top sections of the leg portions 320a and 320b are connected to one another by the central portion 330. The central portion 330 includes a first pair of guide support arms 332a and a second pair of guide support arms 332b. The first pair of guide support arms 332a includes a top guide support arm 334a' and a bottom guide support arm 334a". The top guide support arm 334a' has a notch 336a' and attachment hole 338a' formed therein. And, the bottom guide support arm 334a" has a notch 336a" formed therein. Likewise, the second pair of guide support arms 332b includes a top guide support arm 334b' and a bottom guide support arm 334b". The top guide support arm 334b' has a notch 336b' and attachment hole 338b' formed therein. And, the bottom guide support arm 334b" has a notch 336b" formed therein. Again, details about each of the components that make-up the bracket assembly 300 were described above with respect to bracket assembly 200.

Referring to FIG. 4, there is a flowchart illustrating the basic steps of a preferred method 400 for using the bracket assembly 200 and 300 to guide and support the plug-in card 240 while it is being connected to or disconnected from the backplane 250. For clarity, the description provided below is with reference to the components of bracket assembly 200. But, it should be understood that the description below could also be written with reference to bracket assembly 300.

Beginning at step 402 the bracket assembly 200 is attached to the backplane 250. In the preferred embodiment, the user utilizes captive screws 214a and 214b to secure the bracket assembly 200 to the backplane 250 (see FIGS. 2B–2E). One advantage of the present invention is that the user can "upgrade" an enclosure 260 by adding and attaching a new bracket assembly 200 to an operating backplane 250 without having to shut-down any of the components within the enclosure 260. Alternatively, the manufacturer of the enclosure 260 or the backplane 250 can attach the bracket assembly 200 to the backplane 250 before shipping the enclosure 260 or backplane 250 to a customer.

As described in detail above, the bracket assembly 200 includes two pairs of guide support arms 232a and 232b where each pair of guide support arm 232a and 232b includes a top guide support arm 234a' and 234b' and a bottom guide support arm 234a" and 234b". The top guide support arms 234a' and 234b' have respectively formed therein notches 236a' and 236b' and attachment holes 238a' and 238b'. And, the bottom guide support arms 234a" and 234b" have respectively formed therein notches 236a" and 236b". The notches 236a' 236a", 236b' and 236b" are sized to receive the side edges 241 and 242 of the plug-in card 240 (see FIGS. 2B–2E).

At step 404, the user inserts the side edges 241 and 242 of the plug-in card 240 into the notches 236a' 236a", 236b' and 236b" of the two pairs of guide support arms 232a and 232b (see FIG. 2D). As described above and best shown in FIGS. 2D and 2E, the distances "$d_{2a}$" and "$d_{2b}$" between the top guide support arms 234a' and 234b' and the bottom guide support arms 234a" and 234b" should be selected such that the plug-in card 240 can be easily inserted into and moved within the notches 236a', 236a", 236b' and 236b" while ensuring that the plug-in card 240 remains properly aligned with the pins 252 in the backplane 250. If the distances "$d_{2a}$" and "$d_{2b}$" are too large then the user may have an easy time inserting the plug-in card 240 into the top notches 236a' and 236b' but a difficult time inserting the plug-in card 240 into the bottom notches 236a" and 236b". In contrast, if the distance "$d_{2a}$" and "$d_{2b}$" are too small then the plug-in card 240 may not remain properly aligned with the pins 252 in the backplane 250. For instance, the plug-in card 240 may be inserted into the notches 236a', 236a", 236b' and 236b" but still may be moved in a lateral direction relative to the top surface 254 of the backplane 250 and as such become misaligned with the pins 252 in the backplane 250.

At step 406, the user pushes down on the top edge 243 of the plug-in card 240 such that the side edges 241 and 242 of the plug-in card 240 slide within the notches 236a', 236a", 236b' and 236b" (see FIG. 2D). The location of the bracket assembly 200 and the notches 236a', 236a", 236b' and 236b" ensure that the plug-in card 240 is aligned with and can be properly connected to the pins 252 in the backplane 250.

Lastly at step 408, the user secures the plug-in card 240 to the bracket assembly 200 (see FIG. 2E). In the preferred embodiment, the user utilizes captive screws 246a (only one shown) in the plug-in card 240 to secure the plug-in card 240 to the bracket assembly 200. In particular, the user can turn captive screws 246a (only one shown) into attachment holes 238a' and 238b' that are formed within the top guide support arms 234a' and 234b'. After this is done and if the distance "$d_1$" between the central portion 230 and the backplane 250 is properly selected, then the user at this point can be sure that the plug-in card 240 is properly connected to and fully engaged with the backplane 250 (see FIG. 2E).

It should be readily appreciated by those skilled in the art that the user can reverse steps 404, 406 and 408 and use the bracket assembly 200 to disconnect the plug-in card 240 from the backplane 250 without worrying about bending the pins 252 in the backplane 250. It should also be readily appreciated by those skilled in the art that the connector 245 on the plug-in card 240 can have a wide variety of configurations such as a male connector, a female connector or just plain pins can be connected to a corresponding connector or pins in the backplane 250. For instance, the plug-in card 240 may have pins extending downward from the bottom edge 244 and the backplane 250 can have a female connector sized to interact with the pins in the plug-in card 240.

Although two embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A bracket assembly, comprising:
   a frame, capable of being attached to a backplane, including two pairs of guide support arms that guide and support a plug-in card that is being connected to the backplane, wherein:
      said first pair of guide support arms includes a top guide support arm positioned a predetermined distance over a bottom guide support arm both of which include a notch sized to receive a first side edge of the plug-in card;
      said second pair of guide support arms includes a top guide support arm positioned a predetermined distance over a bottom guide support arm both of which include a notch sized to receive a second side edge of the plug-in card such that a user can interact with a top edge of the plug-in card to move the first side edge and second side edge of the plug-in card within the notches of the two pairs of guide support arms in a manner that enables the plug-in card to be connected to the backplane; and
      said bracket assembly is one piece.

2. The bracket assembly of claim 1, wherein said frame is a U-shaped frame.

3. The bracket assembly of claim 1, wherein each top guide support arm includes an attachment hole that enables a fastener to secure the plug-in card to said frame.

4. The bracket assembly of claim 1, wherein each top guide support arm is located a predetermined distance from the backplane such that when the plug-in card is secured to the top guide support arms then the plug-in card is fully engaged with the backplane.

5. The bracket assembly of claim 1, wherein said predetermined distance each top guide support arm is located over each bottom guide support arm is such that the plug-in card remains aligned with the backplane while the plug-in card is being connected to the backplane.

6. The bracket assembly of claim 1, wherein said plug-in card and backplane are located in an enclosure.

7. The bracket assembly of claim 1, wherein said frame also guides and supports the plug-in card that is being disconnected from the backplane.

8. A bracket assembly comprising:
   a frame capable of being attached to a backplane and further capable of guiding and supporting a plug-in card that is being connected to the backplane, said frame includes:
      two support portions used to attach the frame to the backplane;
      two leg portions extending upward from the two support portions and the backplane;
      a central portion located above the backplane used to connect together the two leg portions, said central portion further includes:
         a first pair of guide support arms that include a top guide support arm positioned a predetermined distance over a bottom guide support arm both of which include a notch sized to receive a first side edge of the plug-in card; and
         a second pair of guide support arms that include a top guide support arm positioned a predetermined distance over a bottom guide support arm both of which include a notch sized to receive a second side edge of the plug-in card such that a user can interact with a top edge of the plug-in card to move the first side edge and second side edge of the plug-in card within the notches of the two pairs of guide support arms in a manner that enables the plug-in card to be connected to the backplane; and
      wherein said bracket assembly is one piece.

9. The bracket assembly of claim 8, wherein said frame is a U-shaped frame.

10. The bracket assembly of claim 8, wherein each top guide support arm includes an attachment hole that enables a fastener to secure the plug-in card to said frame.

11. The bracket assembly of claim 8, wherein each top guide support arm is located a predetermined distance from the backplane such that when the plug-in card is secured to the top guide support arms then the plug-in card is fully engaged with the backplane.

12. The bracket assembly of claim 8, wherein said predetermined distance each top guide support arm is located over each bottom guide support arm is such that the plug-in card remains aligned with the backplane while the plug-in card is being connected to the backplane.

13. The bracket assembly of claim 8, wherein said plug-in card and backplane are located in an enclosure.

14. The bracket assembly of claim 8, wherein said frame also guides and supports the plug-in card that is being disconnected from the backplane.

* * * * *